PROTECTION CIRCUIT INCLUDING POWER DISSIPATION LIMITING MEANS

Filed Oct. 28, 1966

INVENTORS
GENE R. FRUEHLING
JEROME A. JOHNSON
BY
Mueller, Aichele & Rauner
ATTYS.

United States Patent Office 3,431,486

Patented Mar. 4, 1969

3,431,486

PROTECTION CIRCUIT INCLUDING POWER DISSIPATION LIMITING MEANS

Gene R. Fruehling and Jerome A. Johnson, Lombard, Ill., assignors to Motorola, Inc., Franklin Park, Ill., a corporation of Illinois Filed Oct. 28, 1966, Ser. No. 590,351

U.S. Cl. 323—9 8 Claims

Int. Cl. H02h 7/20

Figures 1, 2:
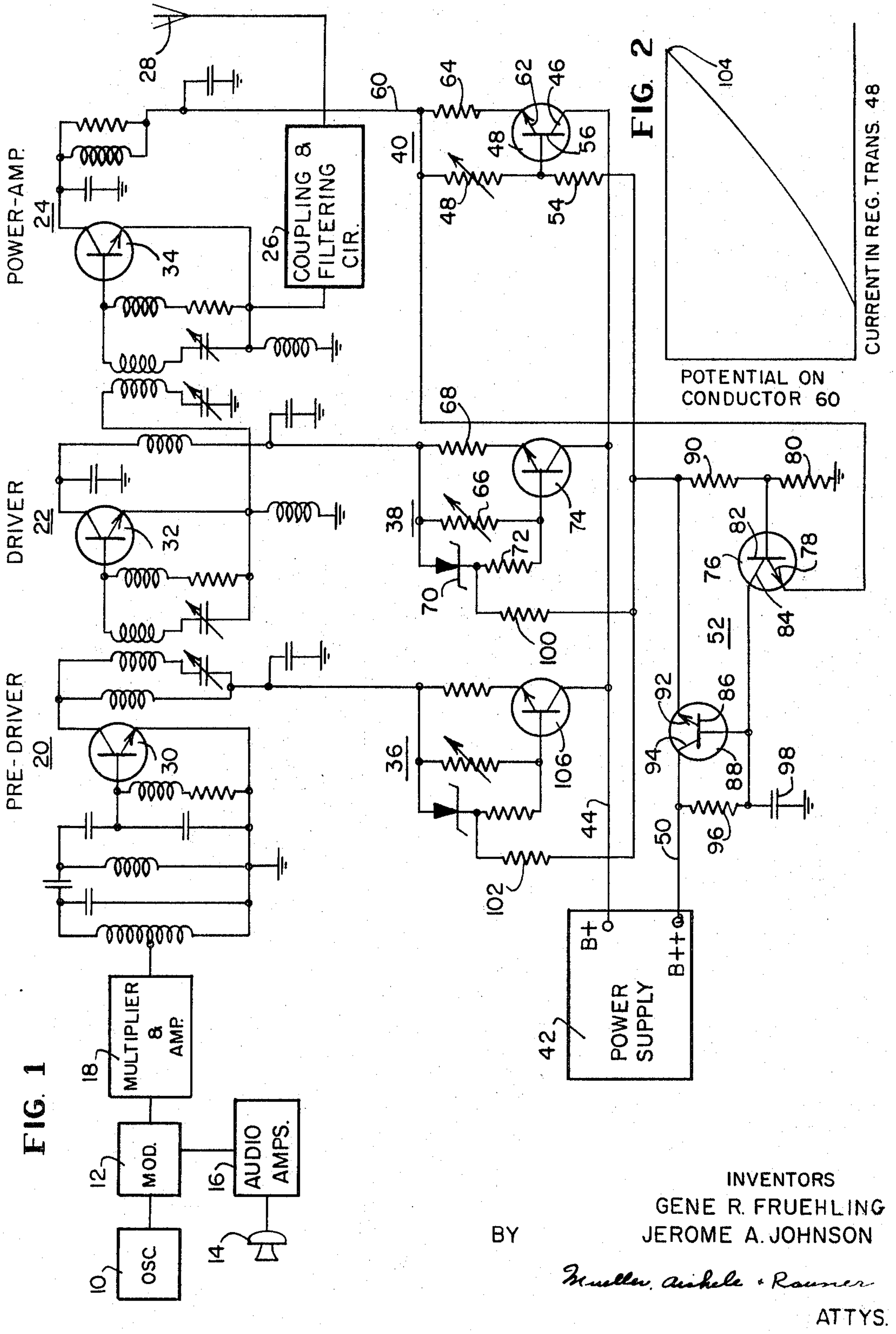

This invention relates in general to a transistorized protection circuit for a semiconductor device and in particular to such a circuit which includes means to limit the power dissipation in the device and in the protection circuit to safe values.

Electronic devices such as transistors and other semiconductor devices used in the output circuits of carrier wave transmitters are subject to damage or destruction by excessive power dissipation therein. If the impedance that the transistor presents to its power supply drops, the current may increase and at a given supply voltage, an excessive power is supplied to the transistor. Such an impedance drop may occur during tuning or if the load impedance coupled to the transistor changes as, for example, when the antenna which is coupled to the output of the transistor is removed or strikes an object such as a tree or bush. If the power in the transistor is sufficiently high, destruction of the transistor may result.

The power supplied to the transistors in the output stages of a transmitter may be maintained below a safe level by using a suitably controlled regulating transistor to supply the operating current to the output transistors. By properly biasing the regulating transistor, it can respond to an attempted increase in the current to the output transistors by reducing the supply voltage thereto to limit the power dissipation. However, when the voltage to the output transistors decreases, a corresponding voltage increase across the limiting transistor is observed and if the operating current through the regulating transistor is maintained constant, the power dissipated therein may become excessive so that this transistor may be destroyed.

In the past, this problem has been alleviated by providing means to shut off the regulating transistor in the presence of an abnormal condition which results in no current flow to insure that no power is dissipated in the regulating transistor. However, the operation of such a circuit has been found to be not entirely satisfactory because when a technician is tuning up the transmitter and causes an abnormal condition such as a reduction in the load impedance to the power amplifier transistor which is being protected, the regulating transistor will turn off so that the power amplifier supplies no power to an indicating device. This necessitates the technician changing the tuning, turning the transmitter back on and perhaps beginning the tuning procedure all over again.

It is, therefore, an object of this invention to provide an improved regulating circuit for protecting semiconductor devices from damage due to excessive power dissipation.

Another object of this invention is to provide a regulating circuit for transistor protection which includes means to limit power dissipation in the regulating circuit.

A further object of this invention is to provide a circuit which responds to an attempted increase in the power in a transistor to lower both the supply voltage and the operating current to the transistor.

Another object of this invention is to provide a regulating circuit for a transistor which decreases the supply voltage and operating current thereto in an abnormal condition and returns the supply voltage and operating current automatically to normal values upon removal of the abnormal condition.

It is another object of this invention to simplify tuning of circuits associated with a semiconductor device by providing a regulating circuit for the device which reduces the power supplied to it rather than removing the power In the drawings:

FIG. 1 is a diagram partially schematic and partially in block of a carrier wave transmitter incorporating the features of the invention; and FIG. 2 is a graph of the voltage current characteristic of the invention of FIG. 1.

In practicing the invention a regulating transistor for protection of a semiconductor device has first and second electrodes coupled respectively to a source of direct current potential and the device. A first bias circuit is coupled to a control electrode of the regulating transistor to establish a bias of a value to cause an operating potential from the source to be applied to the device so that an operating current flows therein. The amount of bias is selected to reduce the operating potential upon an attempted increase of the operating current beyond a predetermined level so as to limit the power dissipation in the device. However, such decrease in operating potential causes a corresponding increase in the voltage across the control transistor thereby subjecting the control transistor to dissipate power in excess of a predetermined maximum value. In order to overcome this without shutting off the regulating transistor, a control transistor is employed with its input and output electrodes respectively coupled to said second and control electrodes of the regulating transistor. A second bias circuit connected to a control electrode of the control transistor establishes a bias thereon of a value to cause the control transistor to respond to a decrease in the operating potential to reduce the bias on the regulating transistor, in proportion to the decrease in operating potential to cause a corresponding decrease in the operating current. Thus, although there is an increase in the voltage across the control transistor, the current through it decreases in order to insure that the power dissipated therein cannot exceed the predetermined maximum value.

Referring now to FIG. 1, a radio transmitter is shown wherein a high frequency signal is developed by oscillator 10 and coupled to modulator 12. Speech signals are converted into electrical signals by microphone 14, amplified in audio amplifiers 16 and coupled to modulator 12 to modulate the high frequency signals from oscillator 10. After the frequency and deviation of the modulated high frequency signal is increased and amplified by the circuits indicated generally by block 18, the signal is amplified by pre-driver circuit 20 and and driver circuit 22. The signal is then further amplified by power amplifier 24, which, although indicated as having a single transistor, usually includes several transistors connected in parallel to furnish the desired high power output. The signal is then translated through coupling and filtering circuit 26 to antenna 28 for radiation of the developed signal.

In order to provide maximum power output from the transmitter, transistors 30, 32 and 34 in pre-driver circuit 20, driver circuit 22 and power amplifier 24 respectively, are operated as close as possible to their maximum power rating. The load presented to the transistors is determined by their respective output circuits, the coupling and filtering circuit 26 and antenna 28. During tuning the load presented to any one transistor may become very low, causing the transistors to draw excessive current and thus excessive power at a given supply voltage level. In addition, the impedance presented to the transistors can change if antenna 28 strikes a bush or tree or is disconnected from the circuit, all of which are common occurrences in mobile transmitter operation.

In order to limit the current drawn by the power amplifier transistors and also by the driver and pre-driver transistors, a separate current limiting circuit for each is provided indicated generally by reference numerals 36, 38 and 40. Referring first to regulating circuit 40, B+ from power supply 42 on conductor 44 is applied to the collector 46 of regulating transistor 48. A biasing circuit for transistor 48 includes a source of B++ potential on conductor 50, a control circuit 52 and a coupling resistor 54 serially connected between the power supply 42 and the base 56 of transistor 48 to establish a potential thereon. A variable threshold setting resistor 48 is connected between the base 56 and conductor 60, the value of which is adjusted to saturate transistor 48 during normal operating conditions. In such a condition, current will flow from the power supply 42 through the collector 46, emitter 62, resistor 64, conductor 60 through the transistor 34 of power amplifier 24. Resistor 64 has a very small value so that there is a minimal voltage drop thereacross. The purpose of this resistor is to provide a convenient metering point for tuning up the transmitter and also to provide temperature compensation for transistor 48. In a saturated condition, the operating potential for power amplifier transistor 34 which appears on conductor 60 is only slightly less than the B+ potential from power supply 42.

The setting of resistor 48 is set so that in an abnormal condition, such as when the impedance in the output circuit of power amplifier 24 drops, and the current in the power amplifier transistor 34 attempts to increase, the operating potential on conductor 60 will decrease. Since the power dissipated in transistor 34 is proportional to the voltage across it times the current through it, the decrease in operating potential during such an abnormal condition serves to keep the power within a safe value. The B++ on conductor 50 is regulated to provide a reference voltage on base 56 of transistor 48 so that the current level at which the operating potential on conductor 60 begins to decrease is maintained at a fixed value.

Similar regulating circuits 36 and 38 are respectively used to protect pre-driver circuit 20 and driver circuit 22 and since they have the same configuration only the latter will be explained. Generally, the operation is similar to regulating circuit 40 except, of course, that the current limiting value is at a lower level. Resistors 66 and 68 correspond respectively to resistors 48 and 64 of power amplifier regulating circuit 40. Since lower current levels are involved here, a Zener diode 70 and a series resistor 72 are connected as shown to provide the reference voltage on the base of transistor 74. Also, it will be noted that the B++ biasing voltage for all three regulating circuits is derived from control circuit 52, the significance of which will be hereinafter explained.

Although the regulating circuits limit the power dissipation in the amplifier and driver circuits which they protect by reducing the operating potential supplied thereto, it will be noted that as this potential decreases, there is a corresponding voltage increase across the respective regulating transistor. If the current level remains constant, the voltage may increase to a point where the current times voltage or power will exceed the capabilities of the particular transistor. To overcome this, control circuit 52 is employed to reduce the current in each of the regulating transistors as the voltage across it increases to thereby limit the power dissipation therein.

The control circuit 52 includes an NPN control transistor 76 having an emitter electrode 78 direct current coupled to conductor 60. A resistor 80 connected to base 82 forms a DC return to ground. The collector 84 is connected to the base 86 of an NPN emitter follower transistor 88, the load for which is a pair of serially connected resistors 90 and 80 connected from the emitter 92 to ground. B++ on conductor 50 is applied to collector 94 via conductor 50 with a resistor 96 connected from collector 94 to base 86 to bias the transistor into operation. A capacitor 98 is connected from collector 84 of transistor 76 to ground to filter the DC control voltage thereon.

In operation, when the operating potential conductor 60 decreases, there will be a corresponding increase in the bias on control transistor 76 to cause an increased current to flow from conductor 50 through resistor 96 and through the collector-to-emitter "junction" of transistor 76. The resulting increased voltage drop across resistor 96 or in other words, the decrease in a control voltage on collector 84, causes a decrease in the bias on transistor 88 to reduce the current which flows through the collector-to-emitter of transistor 88 to result in a decrease in the voltage on emitter 92. This voltage is applied through the resistors 54, 100 and 102 into their associated regulating circuits so as to decrease the bias on the regulating transistors and cause a decrease in the operating current in power amplifier transistor 34, driver transistor 32 and pre-driver transistor 30. The emitter follower transistor is provided to amplify changes in the control voltage on collector 84 of control transistor 76 and may not be necessary if the change is sufficiently great to cause bias reduction on transistor 48. It is important to note that the regulating transistors do not cutoff upon a decrease in the operating potential but rather the current through them decreases with decreasing operating potential.

This may be shown in greater detail by reference to the graph of FIG. 2 in which the operating potential on conductor 60 is plotted against the current through regulating transistor 48. The normal operating point is indicated by reference numeral 104. In the abnormal condition when the operating potential on conductor 60 decreases and the voltage drop across transistor 48 increases, control circuit 52 causes a proportional decrease in the current through the regulating transistor 48 so that the power dissipated therein is reduced to maintain it below a predetermined maximum value.

Not only is emitter 92 of emitter follower transistor 88 coupled to regulating circuit 40, but it is also coupled to regulating circuits 36 and 38. Thus, a decrease in the operating potential on conductor 60 is reflected as a decrease in the bias on transistors 48, 74 and 106, so that the power dissipation in pre-driver circuit 20 and driver circuit 22 will decrease as the current in power amplifier transistor 34 attempts to increase. Also the power dissipation in transistors 74 and 106 will correspondingly decrease so that each of these transistors have a voltage current response similar in appearance to that shown in FIG. 2. It may be appreciated that such an interconnection effectuates limiting the power dissipation in all of the regulating transistors.

An important advantage in reducing the current in an abnormal condition as opposed to cutting it off completely is observed in the tuning up procedure. When, for example, the output circuit of power amplifier 24 is being tuned up, a condition may occur where the impedance presented to the transistor 34 is of a value to attempt to increase the current through it. Cutting off the current at this time may necessitate changing the tuning and/or turning the transmitter on and commence the tuning-up procedure all over again. However, use of this circuit in the presence of an abnormal condition merely causes a decrease in the power observed on a power meter due to the decrease in current in the power amplifier transistor 34. This will indicate to the technician that he is at the wrong point and can continue to tune the circuits until he finds the right point. As the impedance approaches its proper state, the operating current and potential will automatically rise closer to their proper values. A further advantage of not only reducing the operating potential but also reducing the operating current through the respective amplification circuits is an even greater reduction in output power during an abnormal condition thereby further protecting the transistors in these circuits.

What has been described, therefore, is an improved transistorized regulating circuit for a semiconductor device and a control circuit for limiting the power dissipated in the regulating circuit transistor by reduction of the current flow therein.

We claim:

1. A control circuit for a transistorized regulating circuit having a transistor with first, second and third electrodes, direct current potential supply means coupled to the first electrode, a load circuit having a varying impedance coupled to the second electrode, a first bias circuit coupled to said third electrode to bias the transistor and cause an operating potential for the load circuit to appear at the second electrode so that an operating current flows through the load circuit and through the regulating transistor with the first bias circuit providing a bias of a value to cause the operating potential to decrease when the impedance of the load circuit decreases below a predetermined value, such control circuit including in combination, a control transistor having input, output and control electrodes, direct current means coupling the second electrode of the regulating transistor to said input electrode, means coupling said output electrode to the third electrode of the regulating transistor, and a second bias circuit connected to said control electrode to cause said control transistor to respond to a decrease in the operating potential to reduce the bias on the regulating transistor so that the operating current therethrough decreases in proportion to the value of the operating potential, whereby the power in the regulating transistor cannot exceed a predetermined safe value.

2. A protection circuit for a semiconductor device including in combination; direct current potential supply means, a regulating transistor having first, second and third electrodes, said first and second electrodes coupled respectively to said supply means and to said semiconductor device, a first bias circuit coupled to said third electrode to bias the regulating transistor and cause an operating potential for said semiconductor device to appear at said second electrode so that an operating current flows through said regulating transistor and through said device, with the first bias circuit providing a bias of a value to cause said operating potential to decrease when said operating current attempts to increase above a predetermined level so as to limit the power dissipated in said semiconductor device, a control circuit including a control transistor having input, output and control electrodes, direct current means coupling said second electrode of said regulating transistor to said input electrode, means coupling said output electrode to said third electrode, and a second bias circuit connected to said control electrode to establish a bias thereon of a value to cause said control transistor to be responsive to a decrease in said operating potential to develop a control voltage on said output electrode which changes in a direction to reduce the bias on said regulating transistor so that the operating current therethrough decreases in proportion to the value of the operating potential, whereby the power in said regulating transistor cannot exceed a predetermined value.

3. The protection circuit according to claim 2, said control circuit further including an emitter follower transistor coupled between said output electrode of said control transistor and said third electrode of said regulating transistor to amplify changes in said control voltage.

4. The protection circuit according to claim 2, said control transistor being an NPN conductivity type, said input, output and control electrodes being respectively first emitter, collector and base electrodes, said control circuit further including an NPN emitter follower transistor having second emitter, collector and base electrodes, said first collector electrode coupled to said second base electrode, load resistor means connected between said second emitter electrode and a point of reference potential, means applying a DC voltage to said second collector electrode, and means biasing said emitter follower transistor so that changes in said control voltage are amplified and appear on said second emitter electrode, said first base electrode coupled to said load resistor means to form said second bias circuit.

5. In a signal translating system having a plurality of serially coupled amplifier transistors to amplify an applied signal, a plurality of protection circuits individually associated with said amplifier transistors and each including the combination of; a regulating transistor having first, second and third electrodes, means applying a direct current potential to said first electrodes, means coupling said second electrode to an associated amplifier transistor, a first bias circuit connected to said third electrode to bias said regulating transistor and to cause an operating potential to appear at said second electrode for its associated amplifier transistor or so that an operating current flows through said regulating transistor and through its amplifier transistor, the bias being of a value to cause said operating potential to decrease when said operating current attempts to increase above a predetermined level so as to limit the power dissipated in an associated amplifier transistor, a control circuit including a control transistor having input, output and control electrodes, said second electrode of the last of said regulating transistors being direct current coupled to said input electrode, said output electrode coupled to said third electrode of each of said regulating transistors, a second bias circuit connected to said control electrode to establish a bias thereon of a value to cause said control transistor to be responsive to a decrease in said operating potential to develop a control voltage on said output electrode which changes in a direction to reduce the bias on each of said regulating transistors so that the respective operating currents decrease in proportion to the value of said operating potential, whereby the power in each of said regulating transistors cannot exceed a predetermined value.

6. The signal translating system according to claim 5, said first, second and third electrodes being respectively collector, emitter and base electrodes, a resistor connected between said emitter electrode and an associated amplifier transistor and having a value small with respect to the regulating transistor's internal collector-emitter resistance, said first bias circuit including a potentiometer connected between said base electrode and the junction of said resistor and its associated amplifier transistor, said potentiometer adjusted to set said predetermined level.

7. The signal translating system according to claim 5, said control circuit further including an emitter follower transistor coupled between said output electrode of said control transistor and the third electrode of each of said regulating transistors to amplify changes in said control voltage.

8. The signal translating system according to claim 5, said control transistor being an NPN conductivity type, said input, output and control electrodes being respectively first emitter, collector and base electrodes, said control circuit further including an NPN emitter follower transistor having second emitter, collector and base electrodes, said first collector electrode coupled to said second base electrode, load resistor means connected between said second emitter electrode and a point of reference potential, a DC voltage applied to said second collector electrode, means biasing said emitter follower transistor so that changes in said control voltage are amplified and appear on said second emitter electrode, said first base electrode coupled to said load resistor means to form said second bias circuit.

(References on following page)

References Cited

UNITED STATES PATENTS

| | | | |
|---|---|---|---|
| 2,932,783 | 4/1960 | Mohler | 317—33 |
| 2,967,991 | 1/1961 | Deuitch | 323—22 |
| 2,976,474 | 3/1961 | Dodge | 317—33 |
| 3,079,543 | 2/1963 | Decker | 317—33 |
| 3,102,241 | 8/1963 | Johnstone | 323—22 |
| 3,104,353 | 9/1963 | Theobald | 323—22 |
| 3,237,087 | 2/1966 | Greenberg | 317—33 |
| 3,265,956 | 8/1966 | Schlabach | 317—33 |
| 3,303,386 | 2/1967 | Murphy | 317—31 |

JOHN F. COUCH, *Primary Examiner.*

R. V. LUPO, *Assistant Examiner.*

U.S. Cl. X.R.

317—31, 33; 323—22